(12) United States Patent
Mitsubori et al.

(10) Patent No.: US 10,902,904 B1
(45) Date of Patent: Jan. 26, 2021

(54) APPARATUSES AND METHODS FOR PROVIDING MULTIPHASE CLOCKS

(71) Applicant: MICRON TECHNOLOGY, INC., Boise, ID (US)

(72) Inventors: Shingo Mitsubori, Inagi (JP); Kenji Mae, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/568,082

(22) Filed: Sep. 11, 2019

(51) Int. Cl.
| | |
|---|---|
| *G11C 11/4093* | (2006.01) |
| *G11C 7/22* | (2006.01) |
| *G11C 7/10* | (2006.01) |
| *G11C 11/4076* | (2006.01) |
| *H03K 19/20* | (2006.01) |

(52) U.S. Cl.
CPC ........ *G11C 11/4076* (2013.01); *G11C 7/1078* (2013.01); *G11C 7/22* (2013.01); *G11C 7/222* (2013.01); *G11C 11/4093* (2013.01); *H03K 19/20* (2013.01)

(58) Field of Classification Search
CPC ......... G11C 7/22; G11C 7/222; G11C 7/1078; G11C 11/4093
USPC ............. 365/189.16, 233.11, 233.13, 233.12
See application file for complete search history.

(56) References Cited

U.S. PATENT DOCUMENTS

| | | | |
|---|---|---|---|
| 6,671,787 B2 * | 12/2003 | Kanda ................. | G11C 7/1021 365/189.02 |
| 9,680,501 B1 * | 6/2017 | Li .......................... | H03K 3/037 |
| 10,534,394 B2 * | 1/2020 | Lee ......................... | G06F 1/06 |

* cited by examiner

*Primary Examiner* — Son L Mai
(74) *Attorney, Agent, or Firm* — Dorsey & Whitney LLP

(57) ABSTRACT

Apparatuses and methods for providing multiphase clocks are disclosed. An example apparatus includes a plurality of clock circuits, each configured to provide one of the multiphase clocks responsive to a respective input clock. The apparatus further includes first and second control circuits. The first control circuit receives a first one of the multiphase clocks and a reset signal provided to the plurality of clock circuits, and provides a first control signal to reset a clock circuit of the plurality of clock circuits that is based on the first one of the multiphase clocks and the reset signal. The second control circuit receives the control clock and a second one of the multiphase clocks and provides a second control signal to clock the clock circuit of the plurality of clock circuits that is based on the control clock and the second one of the multiphase clocks.

20 Claims, 9 Drawing Sheets

US 10,902,904 B1

APPARATUSES AND METHODS FOR PROVIDING MULTIPHASE CLOCKS

BACKGROUND

Semiconductor memories are used in many electronic systems to store data that may be retrieved at a later time. As the demand has increased for electronic systems to be faster, have greater computing ability, and consume less power, semiconductor memories that may be accessed faster, store more data, and use less power have been continually developed to meet the changing needs.

Semiconductor memories are generally controlled by providing the memories with command signals, address signals, clock signals. The command signals may control the semiconductor memories to perform various memory operations, for example, a read operation to retrieve data from a memory and a write operation to store data to the memory.

With regards to a write operation, data may be provided to the memory serially, that is, as consecutive bits of data that are provided bit-by-bit to data terminals of the memory. The serial data is deserialized internally by the memory to provide the data in parallel for storage in a memory array. Timing of the deserialize operation is controlled by clocks, for example, multiphase clocks having phase relationships relative to the other multiphase clocks.

The multiphase clocks may be provided by internal clock circuits. The internal clock circuits, however, may be subject to variations in performance due to operating conditions of the memory. For example, changing operating conditions may cause the internal clock circuits to inadvertently change the timing of the multiphase clocks, such as providing one or more of the multiphase clocks with glitches, or unexpected changes in clock levels. The clock glitches may cause circuits relying on the clocks, for example, circuits for performing the deserialize operation, to operate unpredictably and with errors. As a result, the data provided in parallel for storage to the memory array may be inaccurate relative to the serially provided data.

Therefore, there may be a desire for circuits providing multiphase clocks that are resistant to unexpected changes in the clock levels, such as clock glitches and the like.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
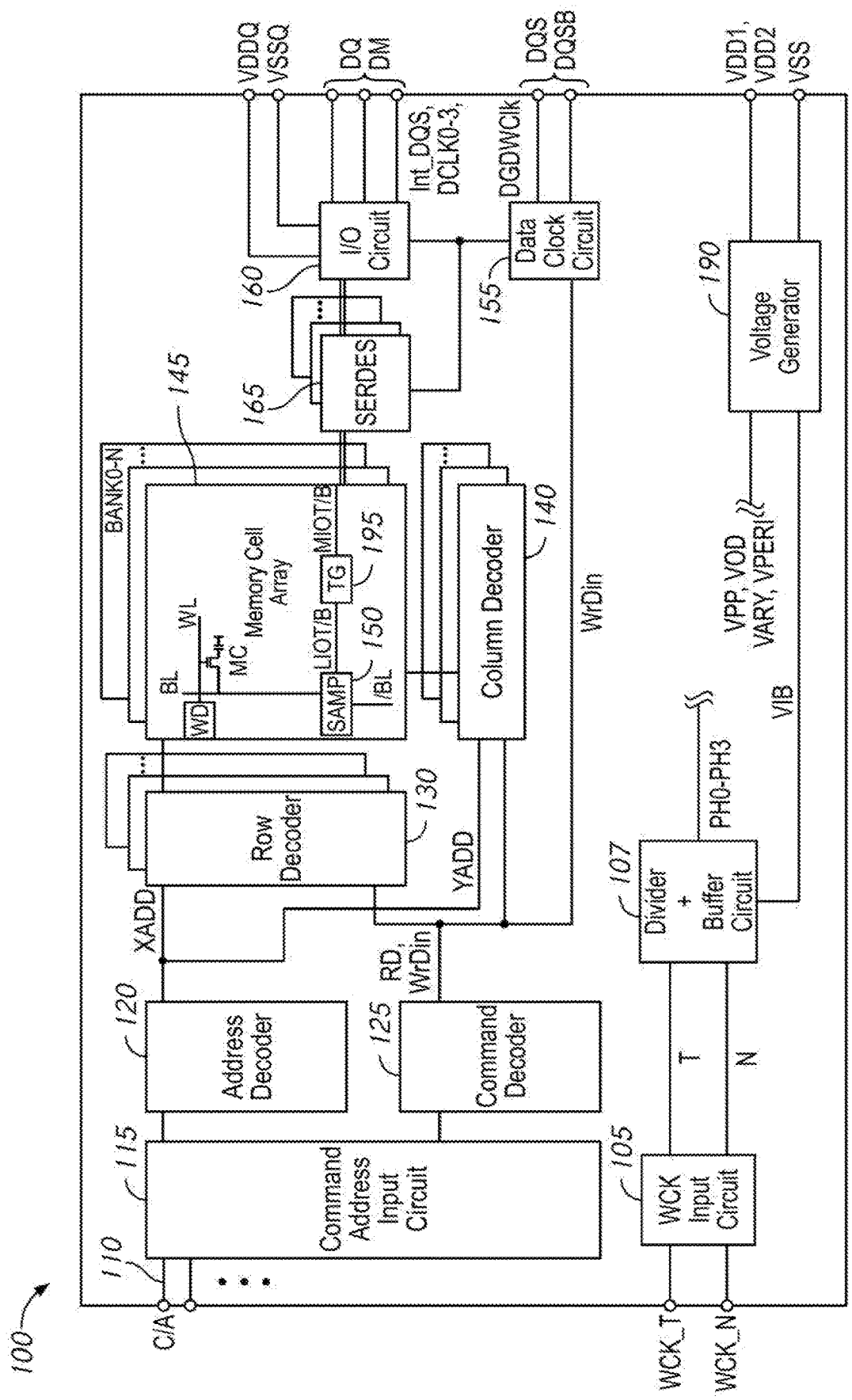
FIG. 1 is a block diagram of a semiconductor device according to an embodiment of the present disclosure.

FIG. 1 is a block diagram of a semiconductor device 100 according to an embodiment of the present disclosure. The semiconductor device 100 may include a memory cell array 145 that includes a plurality of banks 0-N. Each bank 0-N includes a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are provided for their corresponding bit lines BL and coupled to at least one respective local I/O line LIOT/B. The local I/O line LIOT/B is further coupled to a respective one of at least two main I/O line pairs MIOT/B via transfer gates TG 195, which function as switches.

The command/address input circuit 115 may receive an address signal and a bank address signal from outside (e.g., via a memory controller) at the command/address terminals via the command/address bus 110 and may transmit the address signal and the bank address signal to the address decoder 120. The address decoder 120 may decode the address signal received from the command/address input circuit 115 and provide a row address signal XADD to the row decoder 130, and a column address signal YADD to the column decoder 140. The address decoder 120 may also receive the bank address signal and provide a bank address signal to the row decoder 130 and the column decoder 140.

The command/address input circuit 115 may also receive command signals and chip select signals from outside at the command/address terminals via the command/address bus 110 and may provide the command signals and the chip select signals to the command decoder 125. The command signals may include various memory commands, such as activate, read, write, etc. commands. The chip select signals select the semiconductor device 100 to respond to commands and addresses provided to the command and address terminals. The command decoder 125 may decode the command signals to generate various internal command signals. For example, the internal command signals may include a read command signal RD to perform a read operation and a write command signal WrDin to perform a write operation. The internal command signals may be provided to other circuits of the semiconductor device 100 to carry out the corresponding memory operations.

When an activate command is issued with a row address, and a column address is timely supplied with the read command, read data is read from a memory cell in the memory cell array 145 designated by the row address and the column address. The read command may be received by the command decoder 125. Read/write amplifiers of the serializer/deserializer (SERDES) circuitry 165 may receive the read data and provide the read data to an input/output (I/O) circuit 160. The I/O circuit 160 may provide the read data to outside via the data terminals DQ and DM. Similarly, when the activate command is issued with a row address, and a column address is timely supplied with the write command, input buffers of the I/O circuit 160 may receive write data at the data terminals DQ, together with a data mask DM signal. The I/O circuit 160 provides the write data via the read/write amplifiers of the SERDES circuitry 165 to the memory cell array 145. Thus, the write data may be written in the memory cell designated by the row address and the column address. Data clock terminals DQS, DQSB are provided a data clock and are received by a data clock circuit 155. The data clock circuit 155 provides internal data clocks (e.g., Int_DQS, DCLK0-3, DGDWCk) to the I/O circuit 160 and SERDES circuitry 165, which may be used for timing operation of circuits of the I/O circuit 160 for receiving write data and/or providing read data. The data clock circuit 155 is further provided the WrDin signal from the command decoder 125, and the data clock circuit 155 may provide one or more of the internal data clocks based at least in part on the WrDin signal.

The power supply terminals may receive power supply voltages VDD1, VDD2, and VSS. These power supply voltages VDD1, VDD2, and VSS may be supplied to a voltage generator circuit 190. The voltage generator circuit 190 may generate various internal voltages, VPP, VOD, VARY, VPERI, VIB, and the like based on the power supply voltages VDD1, VDD2, and VSS. For example, the internal voltage VIB may be generated using the VDD1 voltage. The internal voltage VIB may have a greater magnitude than the supply voltage VDD2. The internal voltage VPP may be used in the row decoder 130 and column decoder 140. The internal voltages VOD and VARY may be used in the sense amplifiers 150 included in the memory cell array 145. The internal voltage VIB (along with the power supply voltage VDD2) may be used in a data clock (WCK) input circuit 105 and/or the divider and buffer circuit 107. The internal voltage VPERI may be used in many other circuit blocks. The I/O circuit 160 may receive the power supply voltages VDDQ and VSSQ. The power supply voltages VDDQ and VSSQ may be the same voltages as the power supply voltages VDD2 and VSS, respectively. However, the dedicated power supply voltages VDDQ and VSSQ may be used for the I/O circuit 160.

The clock terminals WCK_T and WCK_N may receive an external clock signal WCK_T and a complementary external clock signal WCK_N, respectively. The WCK_T and WCK_N clock signals may be supplied to a WCK input circuit 105. The WCK input circuit 105 may generate complementary internal clock signals T and N based on the WCK_T and WCK_N clock signals. The WCK input circuit 105 may provide the T and N clock signals to the divider and buffer circuit 107. The divider and buffer circuit 107 may generate phase and frequency controlled internal clock signals PH0-PH3 based on the T and N clock signals and a clock enable signal CKE (not shown in FIG. 1). In some embodiments of the disclosure, the PH0-PH3 clock signals may be phase shifted relative to one another by 90 degrees. For example, the PH0 clock signal is phased-shifted 0 degrees relative to the internal clock signal T, the PH1 clock signal is phased-shifted 90 degrees relative to the internal clock signal T, the PH2 clock signal is phased-shifted 180 degrees relative to the internal clock signal T, and the PH3 clock signal is phased-shifted 270 degrees relative to the internal clock signal T.

The SERDES circuitry 165 may support read and write operations by deserializing write data and serializing high speed read data. For example, during a write operation, the SERDES circuitry 165 may be configured to receive serialized write data from the I/O circuit 160 and deserialize the serialized write data (e.g., make it parallel) to provide deserialized write data to memory cell array 145. Additionally, deserialized read data may be received from the memory cell array 145, and the SERDES circuitry 165 may be configured to serialize the deserialized read data to provide serialized read data to the I/O circuit 160.

Figure 2:
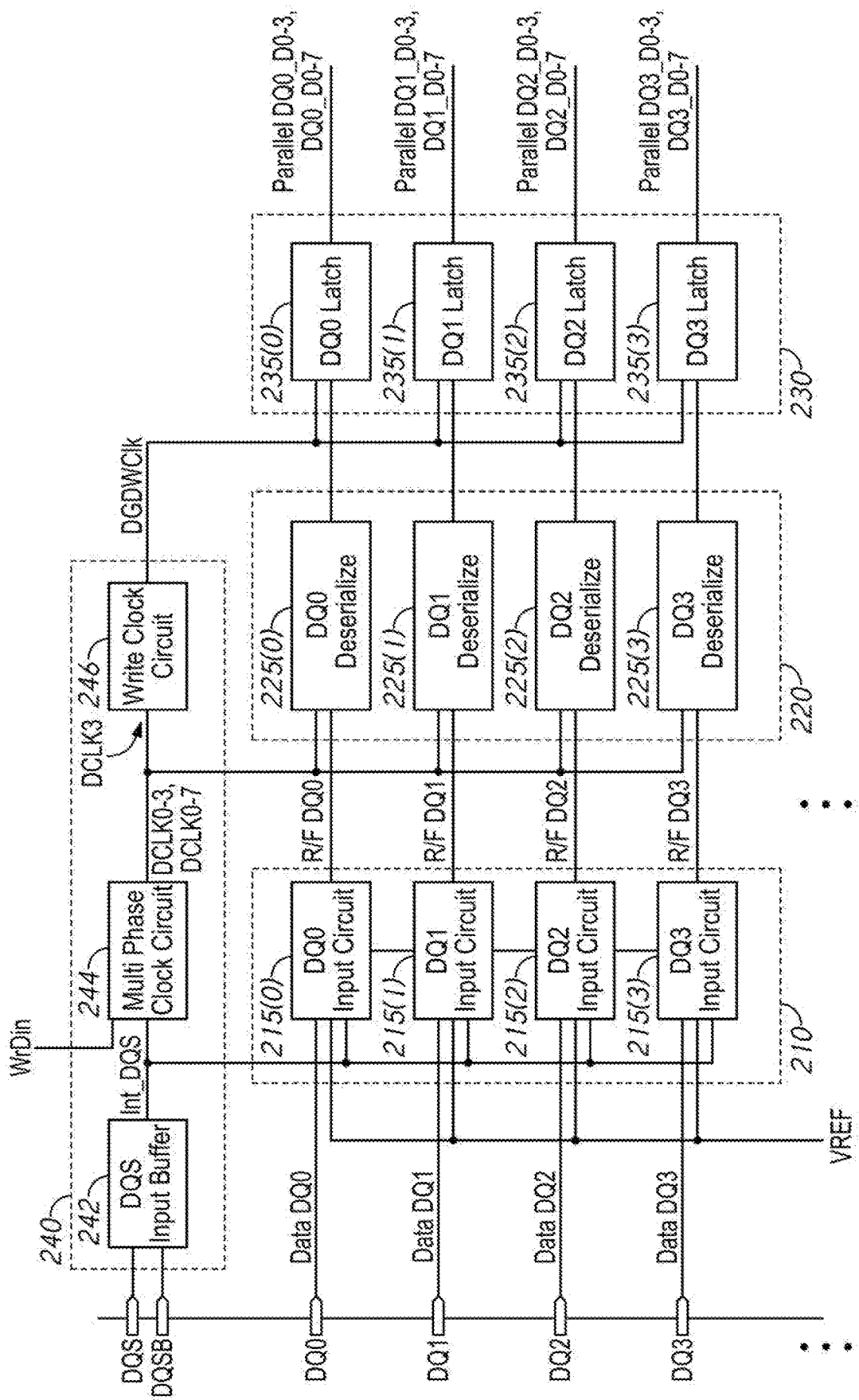
FIG. 2 is a block diagram of an input data buffer, deserializer, data latch, and internal data clock circuit according to an embodiment of the disclosure.

FIG. 2 is a block diagram of an input data buffer 210, deserializer 220, data latch 230, and internal data clock circuit 240 according to an embodiment of the disclosure. Each of the input data buffer 210, deserializer 220, and data latch 230 may be included in one or more circuits of a semiconductor device, such as an input-output circuit, serializer/deserializer (SERDES) circuitry, or other circuit. For example, in some embodiments of the disclosure, each of the input data buffer 210, deserializer 220, and data latch 230 may be included in the input-output circuit 160 and/or serializer/deserializer circuitry 165 of semiconductor device 100 of FIG. 1. The internal data clock circuit 240 may be included in the internal data clock circuit 155 of FIG. 1 in some embodiments of the disclosure.

The internal data clock circuit 240 includes a data clock (DQS) input buffer 242, multiphase clock circuit 244, and write clock circuit 246. The DQS input buffer 242 receives external data clocks DQS and DQSB and provides an internal data clock Int_DQS based on the DQS and DQSB clocks. The DQS and DQSB clocks may be complementary and the Int_DQS clock may have a same clock frequency as the DQS and DQSB clocks. The Int_DQS clock is provided to the multiphase clock circuit 244. The multiphase clock circuit 244 also receives an internal write command signal WrDin. The WrDin signal may be provided by a command decoder in response to a write command. For example, the WrDin signal may be provided by the command decoder 125 of FIG. 1 in some embodiments of the disclosure. The multiphase clock circuit 244 provides clocks DCLK0-DCLK3 based on the Int_DQS clock and the WrDin signal. The DCLK0-DCLK3 clocks may have a phase relationship relative to one another. For example, The DCLK0-DCLK3 clocks may have a 90 degree phase relationship relative to one another (e.g., DCLK0 clock may be at a 0 degree phase, DCLK1 clock at a 90 degree phase, DCLK2 clock at a 180 degree phase, and DCLK3 at a 270 degree phase). The DCLK0-DCLK3 clocks may also have a different clock frequency than the Int_DQS clock. For example, in some embodiments of the disclosure, the DCLK0-DCLK3 clocks may have a clock frequency that is one-half of a clock frequency of the Int_DQS clock. A clock of the DCLK0-DCLK3 clocks is provided to the write clock circuit 246, which provides a clock DGDWClk based on the clock of the DCLK0-DCLK3 clocks. For example, in some embodiments of the disclosure, the DCLK3 clock is provided to the write clock circuit 246, which provides the DGDWClk clock based on the DCLK3 clock. A clock other than the DCLK3 clock may be provided in some embodiments of the disclosure.

The Int_DQS clock is provided by the internal data clock generator 240 to the input data buffer 210, the DCLK0-

DCLK3 clocks provided to the deserializer 220, and the DGDWClk clock provided to the data latch 230.

The input data buffer 210 includes input circuits 215(0)-215(3), each receiving the Int_DQS clock from the internal data clock circuit 240 and a reference voltage VREF. The reference voltage VREF may be provided by a reference voltage circuit, which may be included in a voltage generator (e.g., voltage generator 190 of FIG. 1). Each of the input circuits 215 is also receives data from a respective data terminal DQ. The data is provided to each of the input circuits 215 in a serial manner. For example, the data to each input circuit 215 includes consecutive bits of data that are provided bit-by-bit to the input circuit 215. The input circuits 215 latch the data from the respective data terminal DQ based on timing of the Int_DQS clock. For example, data received from the respective data terminal DQ is latched as the Int_DQS clock transitions from a low clock level to a high clock level (e.g., a rising edge of the Int_DQS clock) and latched as the Int_DQS clock transitions from a high clock level to a low clock level (e.g., a falling edge of the Int_DQS clock). A logic state of the data received by the input circuits 215 is determined based on a voltage of a data signal representing the data relative to the VREF voltage. For example, a data signal having a voltage greater than the VREF voltage may be latched as data having a high logic state (e.g., logic "1") and a data signal having a voltage less than the VREF voltage may be latched as data having a high logic state (e.g., logic "0"). The latched data is provided to the deserializer 220. Each input circuit 215 may provide the latched data on one or more respective signal lines. For example, in some embodiments of the disclosure, each input circuit provides the latched data on two signal lines. Data latched by the input circuit 215 at rising edges of the Int_DQS clock may be provided on one signal line and data latched by the input circuit 215 at falling edges of the Int_DQS clock may be provided on the other signal line.

The deserializer 220 includes deserializer circuits 225(0)-225(3), each receiving one or more of the DCLK0-DCLK3 clocks and receiving data from a respective one of the input circuits 215 of the input data buffer 210. Each deserializer circuit 225 latches data provided by the respective input circuit 215 and provides multiple latched bits of data in parallel (e.g., concurrently) based on timing of the one or more DCLK0-DCLK3 clocks. For example, data received from the respective input circuit 215 is latched by the deserializer circuit 225, and when a number of bits have been latched, the multiple bits of data are provided as the respective one or more of the DCLK0-DCLK3 clocks transitions between high and low clock levels (e.g., rising and/or falling edges of the one or more of the DCLK0-DCLK3 clocks). The multiple bits of data are provided in parallel by the input circuits 225(0)-225(3) to the data latch 230.

In some embodiments of the disclosure, four bits of data are provided in parallel by each deserializer circuit 225. In such embodiments of the disclosure, the serial bits of data may be provided to the data input buffer 210 in bursts of four bits (e.g., burst length BL=4). In some embodiments of the disclosure, eight bits of data are provided in parallel by each deserializer circuit 225. Other embodiments of the disclosure may provide greater or fewer bits in parallel. In such embodiments of the disclosure, the serial bits of data may be provided to the data input buffer 210 in bursts of eight bits (e.g., burst length BL=8).

The data latch 230 includes data latch circuits 235(0)-235(3), each receiving the DGDWClk clock and receiving data from a respective one of the deserializer circuits 225 of the deserializer 220. Each data latch circuit 235 latches the data from the respective deserializer circuit 225 based on timing of the DGDWClk clock. For example, the data is latched when the DGDWCk clock transitions from a high clock level to a low clock level (e.g., a falling edge of the DGDWClk clock). The data is provided by the data latch circuits 235(0)-235(3) to respective internal data lines. The data provided to the internal data lines may be stored in a memory array, for example, memory cell array 145 of FIG. 1 in some embodiments of the disclosure.

Figure 3:
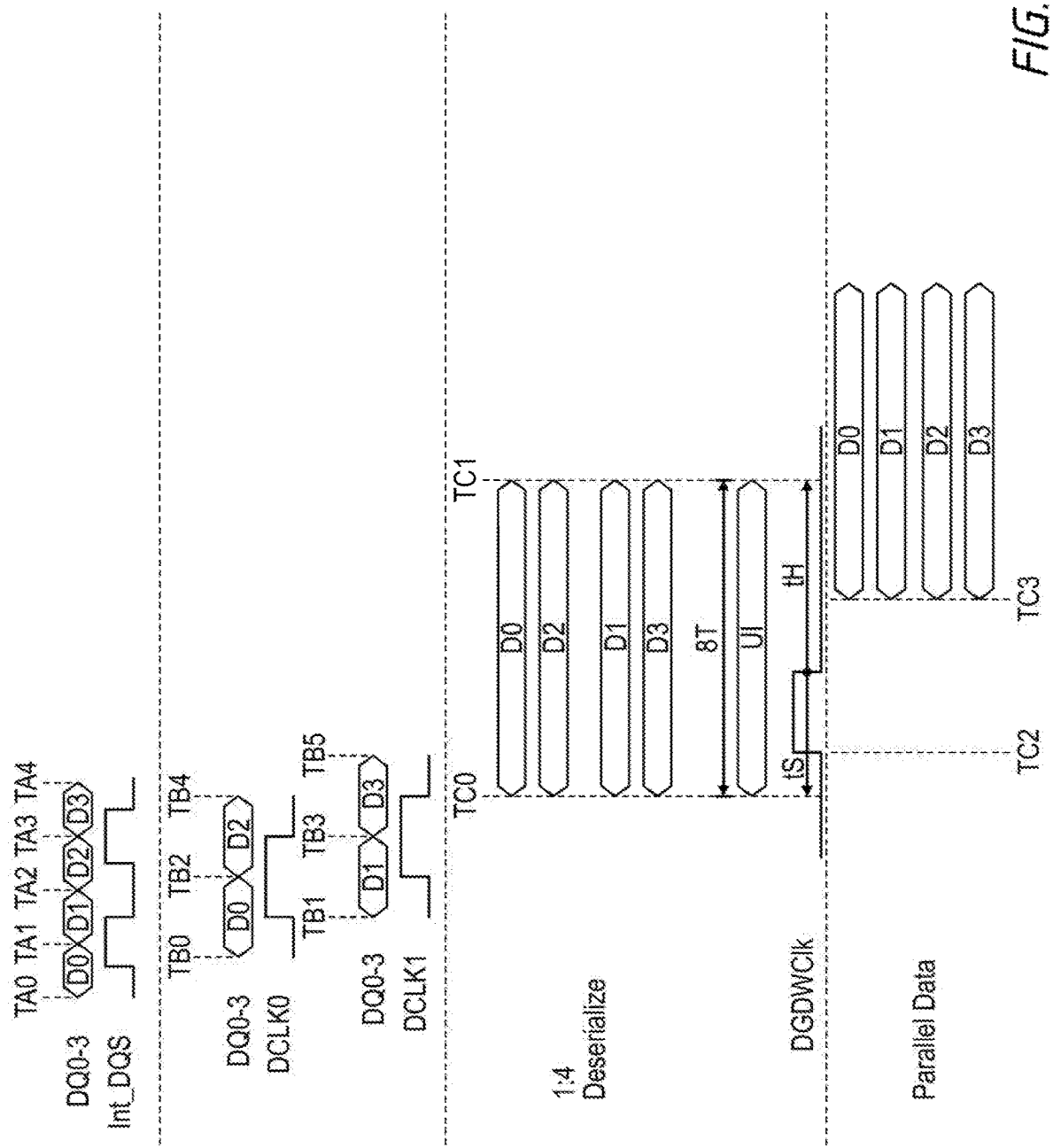
FIG. 3 is a diagram showing operation of an input circuit, deserializer circuit, and data latch circuit according to an embodiment of the disclosure.

FIG. 3 is a diagram showing operation of an input circuit, deserializer circuit, and data latch circuit according to an embodiment of the disclosure. In some embodiments of the disclosure, the input circuit, deserializer circuit, and data latch circuit are included in the input data buffer 210, deserializer 220, data latch 230, and internal data clock circuit 240 of FIG. 2 and operated as shown in FIG. 3. The operation of FIG. 3 will be described with reference to the input circuit 215, deserializer circuit 225, and data latch circuit 235 of FIG. 2.

Data D0-D3 is received serially by input circuit 215 from the respective data terminal DQ. The data D0-D3 represents a data burst of 4-bits (e.g., burst length BL of 4). Data D0 is provided between times TA0 and TA1, data D1 is provided between times TA1 and TA2, data D2 is provided between times TA2 and TA3, and data D3 is provided between times TA3 and TA4 on the data terminal DQ. The time between times TA0-TA1, TA1-TA2, TA2-TA3, and TA3-TA4 may be equal to one another. The data D0-D3 is latched as the Int_DQS clock transitions between high and low clock levels. For example, data D0 and D2 are latched at rising clock edges of the Int_DQS clock between times TA0 and TA1 and between times TA2 and TA3, respectively, and data D1 and D3 are latched at falling clock edges of the Int_DQS clock between times TA1 and TA2 and between times TA3 and TA4.

The latched data are provided on two signal lines by the input circuit 215, with data D0 and D2 (e.g., rising edge data) provided on a first signal line and data D1 and D3 (e.g., falling edge data) provided on a second signal line. The data D0 is provided between times TB0 and TB2 and data D2 provided between times TB2 and TB4 on the first signal line. The data D1 is provided between times TB1 and TB3 and data D3 provided between times TB3 and TB5 on the second signal line. The time between times TB0-TB2, TB1-TB3, TB2-TB4, and TB3-TB5 may be equal to one another. The time a bit of data is provided on the first or second signal line is greater than the time a bit of data is provided on the data terminal DQ. For example, bit of data D0 is provided on the first signal line for a time TB0-TB2 whereas bit of data D0 is provided on the data terminal DQ for a time TA0-TA1. The time TB0-TB2 is greater than time TA0-TA1. In some embodiments of the disclosure, the time TB0-TB2 is twice as long as time TA0-TA1.

The data D0-D3 provided by the input circuit 215 on the two signal lines are latched by deserializer 225 as one or more of the DCLK0-DCLK3 clocks transition between high and low clock levels. In the example of FIG. 3, two clocks DCLK0 and DCLK1 are used by the deserializer 225 to latch the data D0-D3. For example, data D0 is latched at a rising edge of the DCLK0 clock between times TB0 and TB2, data D1 is latched at a rising edge of the DCLK1 clock between times TB1 and TB3, data D2 is latched at a falling edge of the DCLK0 clock between times TB2 and TB4, and data D3 is latched at a falling edge of the DCLK1 clock between times TB3 and TB5. The clock used for the deserializer 225 may be different in some embodiments of the disclosure.

The latched data are provided on respective signal lines by the deserializer circuit 225. The data D0-D3 are provided between times TC0 and TC1. The time a bit of data is provided on the respective signal lines is greater than the time a bit of data is provided on the first or second signal lines (and also greater than the time a bit of data is provided to the input circuit 215 on the data terminal DQ). For example, the time data D0 is provided between times TC0-TC1 may is greater than the time data D0 is provided between times TB0-TB2 (and greater than the time between times TA0-TA1). In some embodiments of the disclosure, the time TC0-TC1 is four times as long as time TB0-TB2 (and eight times as long as time TA0-TA1).

The data on the respective signal lines is provided to data latch circuits 235, which latch the data based on the DGDWClk clock. The latched data is then provided by the data latch circuits 235 to internal data lines to be written to the memory array. For example, the in an example operation DGDWClk clock becomes active at time TC2 and the latched data is provided at time TC3. In some embodiments of the disclosure, the DGDWClk clock is based on the DCLK3 clock.

As shown by the example operation of FIG. 3, data provided serially on data terminal DQ may be deserialized and provided in parallel, for example, for writing to a memory array. The data may be provided in parallel by data latch circuits 235 for a greater time than provided on the data terminal DQ to the input circuit 215. In this manner, there is greater timing margin for performing internal operations, such as writing data to the memory array.

Figure 4:
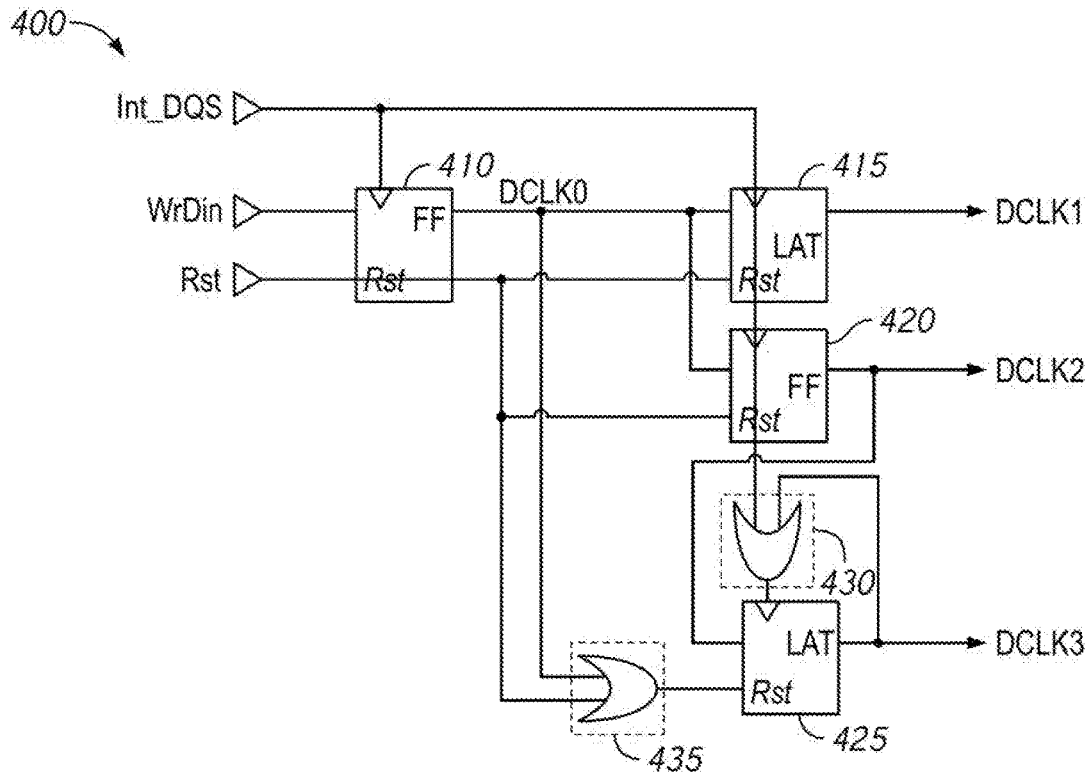
FIG. 4 is a schematic diagram of a multiphase clock circuit according to an embodiment of the disclosure.

FIG. 4 is a schematic diagram of a multiphase clock circuit 400 according to an embodiment of the disclosure. The multiphase clock circuit 400 may be included in the multiphase clock circuit 244 of FIG. 2 in some embodiments of the disclosure. The multiphase clock circuit 400 may be included in the internal data clock circuit 155 of FIG. 1 in some embodiments of the disclosure.

The multiphase clock circuit 400 includes clock circuits 410, 415, 420, and 425, and control circuit 430 and control circuit 435. Each of the clock circuits 410, 415, 420, and 425 may include a clocked circuit. For example, in some embodiments of the disclosure, the clock circuits 410 and 420 may include flip-flop (FF) circuits, and the clock circuits 415 and 425 may include latch circuits. The control circuits 430 and 435 may include logic gates. for example, in some embodiments of the disclosure, the control circuits 430 and 435 include OR logic gates (OR).

The clock circuits 410 and 420, and clock circuit 415 are provided an internal data clock Int_DQS and a reset signal Rst. The Int_DQS clock is also provided to the control circuit 430 and the Rst signal is also provided to the control circuit 435. The multiphase clock circuit 400 provides clocks DCLK0-DCLK3 having a 90 degree phase relationship relative to one another. The DCLK0-DCLK3 clocks have a clock frequency that is one-half a clock frequency of the Int_DQS clock.

The clock circuit 410 receives internal write command signal WrDin, and provides a clock DCLK0 having a clock level corresponding to a logic level of the WrDin signal when the Int_DQS clock changes from a low clock level to a high clock level. The DCLK0 clock is provided to clock circuit 415 and clock circuit 420. The DCLK0 is also provided to the control circuit 435.

When the Int_DQS clock is a low clock level, the clock circuit 415 provides a clock DCLK1 having a clock level corresponding to the clock level of the DCLK0 clock. When the Int_DQS changes from the low clock level to a high clock level, the clock circuit 415 latches the clock level of the DCLK0 and provides the DCLK1 clock having a clock level of the latched DCLK0 clock. While latched (e.g., the Int_DQS clock is a high clock level), the clock circuit 415 continues to provide the latched clock level as the DCLK1 clock despite the DCLK0 changing clock levels. The clock circuit 420 provides a clock DCLK2 having a clock level corresponding to the clock level of the DCLK0 clock when the Int_DQS clock changes from a low clock level to a high clock level. The DCLK2 clock is provided to the clock circuit 425.

The clock circuit 425 provides a clock DCLK3 having a clock level of the DCLK2 clock when both the Int_DQS clock is a low clock level and the DCLK3 clock is at a low clock level. When the Int_DQS or the DCLK3 clock changes from the low clock level to a high clock level, the clock circuit 425 latches the clock level of the DCLK2 clock and provides the DCLK3 clock having a clock level of the latched DCLK2 clock. While latched (e.g., the Int_DQS clock or the DCLK3 clock is a high clock level), the clock circuit 425 continues to provide the latched clock level as the DCLK3 clock despite the DCLK2 changing clock levels. The control circuit 430 prevents the clock circuit 425 from changing the clock level of the DCLK3 clock until the clock circuit 425 is again latched by the Int_DQS changing from the low clock level to the high clock level (and/or is reset by the control circuit 435 for a rising clock edge of the DCLK0 clock).

The clock circuits 410 and 420, and the clock circuit 415 are reset to provide the DCLK0-DCLK2 clocks having a known clock level (e.g., low clock level) when the Rst signal is active (e.g., active high logic level). The clock circuit 425 is reset to provide the DCLK3 clock having a known clock level (e.g., low clock level) when the Rst signal is active or when the DCLK0 clock is a high clock level (e.g., before a next rising clock edge for the DCLK3 clock). While FIG. 4 shows the DCLK0 clock as provided to the control circuit 435 for resetting the clock circuit 425 (e.g., reset DCLK3 to a low clock level), embodiments of the disclosure are not limited to using DCLK0 for resetting the clock circuit 425. Embodiments of the disclosure include providing one or more of DCLK0-DCLK2 clocks to the control circuit 435 for resetting the clock circuit 425. For example, in some embodiments of the disclosure, the DCLK1 clock is used (additionally or alternatively to the DCLK0 clock) for resetting the DCLK3 clock. In some embodiments of the disclosure, the DCLK2 clock is used (additionally or alternatively to the DCLK0 clock) for resetting the DCLK3 clock.

Figure 5:
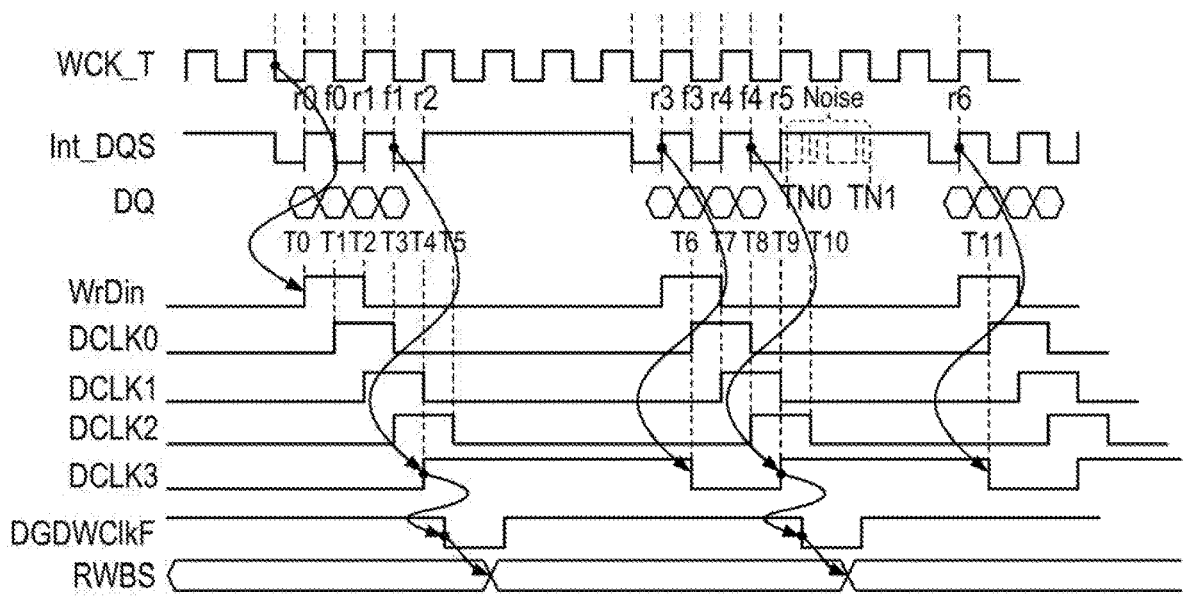
FIG. 5 is a timing diagram of various clocks and signals during operation of the multiphase clock circuit of FIG. 4.

Operation of the multiphase clock circuit 400 will be described with reference to FIG. 5. FIG. 5 is a timing diagram of various clocks and signals during operation of the multiphase clock circuit 400.

FIG. 5 shows external clock WCK_T and the Int_DQS clock along with corresponding data DQ and an internal write command WrDin. The data is shown as a burst length of four bits. Multiphase clocks DCLK0-DCLK3 provided by the multiphase clock circuit 400 are shown having a 90-degree phase relationship, and a clock DGDWClk and internal data signal lines RWBS are shown relative to the DCLK0-DCLK3 clocks.

At time T0, the internal write command WrDin becomes active (e.g., active high logic level). A rising clock edge T0 of the Int_DQS clock causes the clock circuit 410 to later provide a DCLK0 clock having a high clock level following a propagation delay (e.g., at time T1, as described below) corresponding to the high logic level of the internal write command WrDin. The r0 clock edge of the Int_DQS clock causes the clock circuit 415 to latch the low clock level and provide the DCLK1 clock having a low clock level corresponding to the low clock level of the DCLK0 clock. The r0 clock edge causes the clock circuit 420 to provide a DCLK2 clock having a low clock level corresponding to the low clock level of the DCLK0 clock, and also causes the clock circuit 425 to latch the low clock level of the DCLK2 clock and provide the DCLK3 clock having a low clock level.

Following the propagation delay, at time T1 the DCLK0 clock provided by the clock circuit 410 changes from the low clock level to the high clock level (e.g., DCLK0 becomes active). The high clock level DCLK0 clock resets the clock circuit 425 to provide a low clock level DCLK3 clock (e.g., DCLK becomes inactive), if not already at a low clock level. A falling clock edge f0 of the Int_DQS clock causes the clock circuit 415 to later provide the DCLK1 clock having the high clock level following a propagation delay (e.g., at time T2, as described below) based on the high clock level of the DCLK0 clock. The clock circuit 420 continues to provide the low clock level DCLK2 clock and the clock circuit 425 continues to provide the low clock level DCLK3 clock.

Following the propagation delay, at time T2 the DCLK1 clock provided by the clock circuit 415 changes from the low clock level to the high clock level (e.g., DCLK1 becomes active). A rising clock edge r1 of the Int_DQS clock causes the clock circuit 410 to later provide the DCLK0 clock having a low clock level following a propagation delay (e.g., at time T3, as described below) corresponding to the low logic level of the internal write command WrDin. The r1 clock edge causes the clock circuit 415 to latch the high clock level DCLK0 clock to continue to provide the high clock level DCLK1 clock. The r1 clock edge also causes the clock circuit 420 to later provide the DCLK2 clock having a high clock level following a propagation delay (e.g., at time T3, as described below) based on the high clock level of the DCLK0 clock. The r1 clock edge causes clock circuit 425 to latch the low clock level DCLK2 clock to continue providing the low clock level DCLK3 clock.

Following the propagation delay, at time T3 the DCLK0 clock provided by the clock circuit 410 changes from the high clock level to the low clock level (e.g., DCLK0 becomes inactive) and the DCLK2 clock provided by the clock circuit 420 changes from the low clock level to the high clock level (e.g., DCLK2 becomes active).

A falling clock edge f1 of the Int_DQS clock causes the clock circuit 415 to later provide the DCLK1 clock having the low clock level following a propagation delay (e.g., at time T4, as described below) based on the low clock level of the DCLK0 clock. The f1 clock edge also causes the clock circuit 425 to later provide the DCLK3 clock having the high clock level following a propagation delay (e.g., at time T4, as described below) based on the high clock level of the DCLK2 clock.

Following the propagation delay, at time T4 the DCLK1 clock provided by the clock circuit 415 changes from the high clock level to the low clock level (e.g., DCLK1 becomes inactive) and the DCLK3 clock provided by the clock circuit 425 changes from the low clock level to the high clock level (e.g., DCLK3 becomes active). The DCLK3 clock may be used to provide the DGDWClk clock. As previously described, the DGDWClk clock may be provided to a data latch circuit (e.g., data latch 230 of FIG. 2) that latches and provides data to internal data lines, shown in FIG. 5 as RWBS.

A rising clock edge r2 of the Int_DQS clock causes the clock circuit 420 to later provide the DCLK2 clock having a low clock level following a propagation delay (e.g., at time T5, as described below) based on the low clock level of the DCLK0 clock. The clock circuit 410 continues to provide the low clock level DCLK0 clock based on the low logic level WrDin command.

Following the propagation delay, at time T5 the DCLK2 clock provided by the clock circuit 420 changes from the high clock level to the low clock level (e.g., DCLK2 becomes inactive). As the Int_DQS clock remains at a high clock level, the clock levels for DCLK0-DCLK3 remain the same following time T5.

A rising clock edge r3 of the Int_DQS clock causes the clock circuit 425 to latch the low clock level of the DCLK2 clock to later provide the DCLK3 clock having a low clock level (e.g., DCLK3 becomes inactive) following a propagation delay (e.g., at time T6). Thus, when the DCLK3 clock is at a high clock level, a rising clock edge of the Int_DQS clock may cause the DCLK3 clock to change to a low clock level.

The rising clock edge r3 and active internal write command WrDin represent the start of a new cycle for providing the DCLK0-DCLK3 clocks as previously described, with the clock edges r3, f3, r4, f4, and r5 representing clock edges r0, f0, r1, f1, and r2. As the Int_DQS clock changes between the high and low clock levels at clock edges r3, f3, r4, f4, and r5, a new cycle of DCLK0-DCLK3 clocks are provided between times T6-T10 as previously described for times T1-T5.

Following the clock edge r5 of the Int_DQS clock, FIG. 5 shows example noise (e.g., glitches) of the Int_DQS clock (e.g., shown in dashed line). The noise causes unplanned changes in the clock level of the Int_DQS clock. For example, the noise causes the Int_DQS clock to change between high and low clock levels between times TN0-TN1.

Although the Int_DQS clock changes between the high and low clock levels due to noise, the DCLK3 clock is unaffected and remains at the high clock level until a rising clock edge r6 causes the clock circuit 425 to latch the low clock level of the DCLK2 clock and later provide the DCLK3 clock having the latched low clock level following a propagation delay (e.g., at time T11). Thus, noise in the Int_DQS clock is ignored by the clock circuit 425 to prevent unexpected changes in the clock level of the DCLK3 clock. An unexpected change, for example, the DCLK3 clock changing to a low clock level unexpectedly may result in failure to provide a DGDWClk clock, and thus, failure to clock a data latch circuit to provide data to the internal data lines RWBS.

Figure 6A:
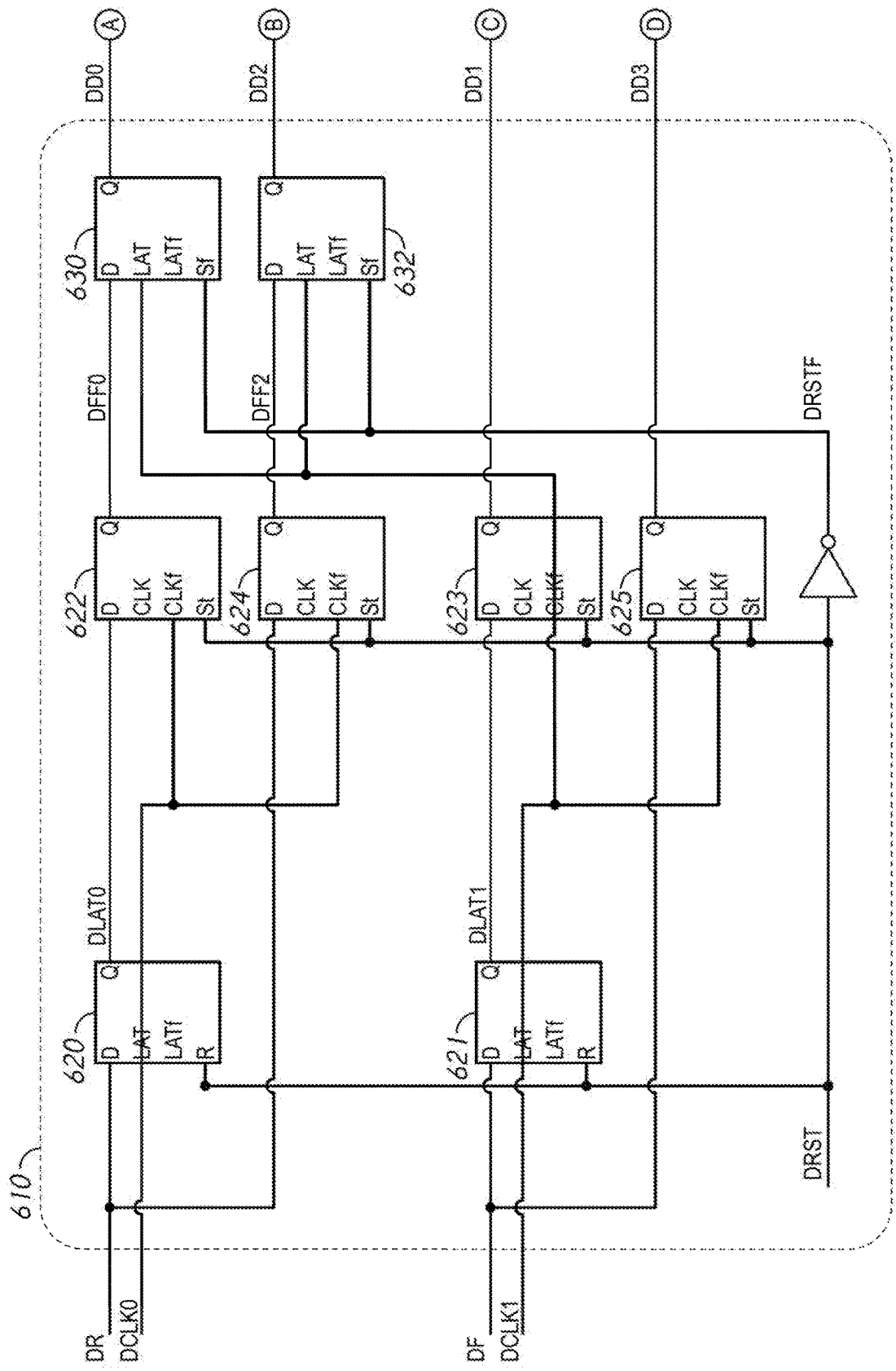
FIGS. 6A and 6B are block diagrams of a deserializer circuit and a data latch circuit according to an embodiment of the disclosure.
Figure 6B:
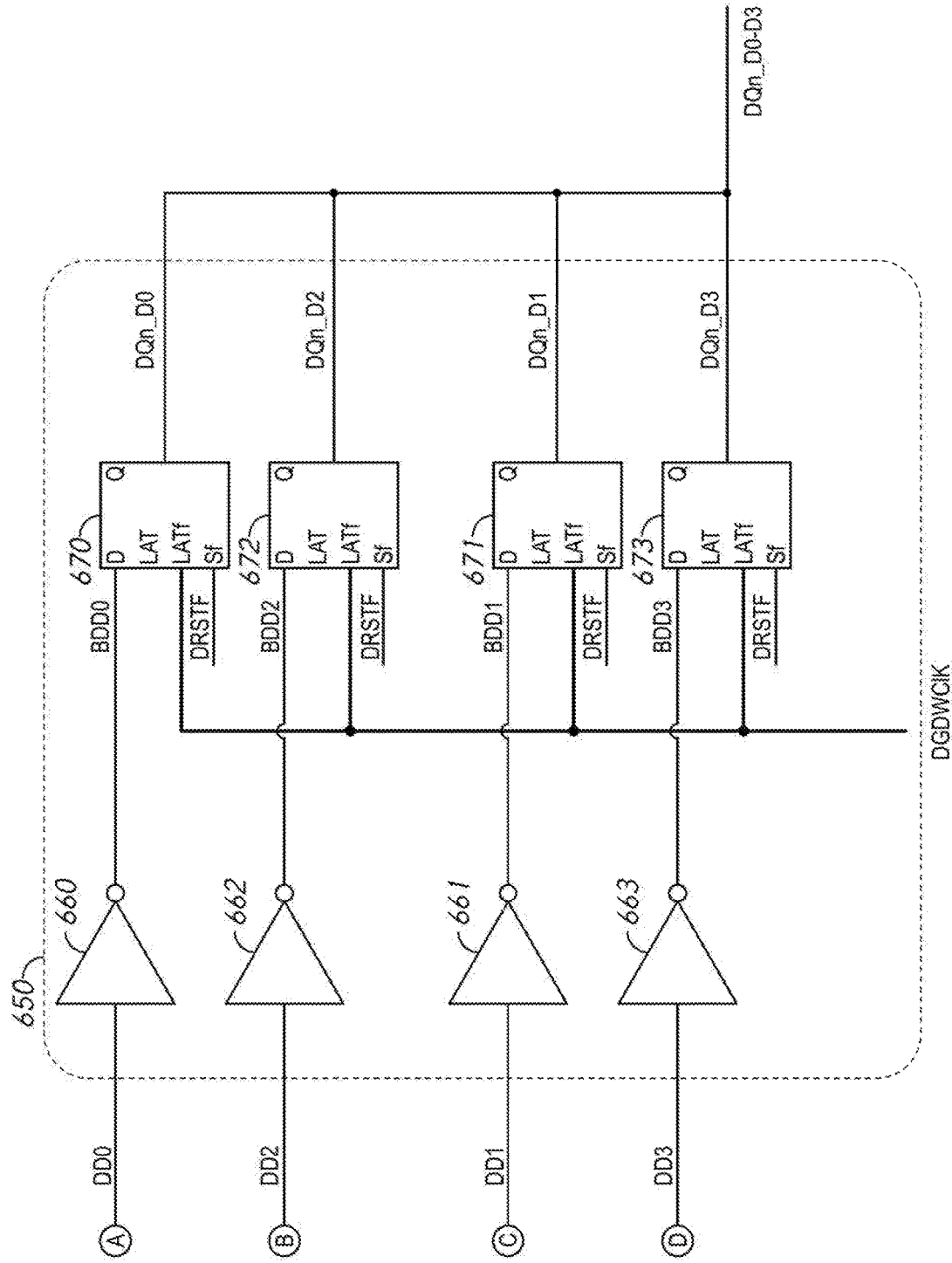

FIGS. 6A and 6B am a block diagrams of a deserializer circuit 610 and a data latch circuit 650 according to an embodiment of the disclosure. The deserializer circuit 610 is shown in FIG. 6A and the data latch circuit 650 is shown in FIG. 6B. In some embodiments of the disclosure, the deserializer circuit 610 and/or the data latch circuit 650 is included in the deserializer circuit 225 and/or data latch circuit 235 of FIG. 2. The deserializer circuit 610 and data latch circuit 650 may be included for each external data terminal that is provided serial data.

The deserializer circuit 610 includes a first data path and a second data path. The first data path receives data DR from an input circuit (e.g., input circuit 215 of FIG. 2) provided on a first data signal line and the second data path receives data DF from the input circuit provided on the second data signal line. In some embodiments of the disclosure, the data DR received on the first data signal line correspond to data latched by the input circuit at first clock edges of the Int_DQS clock, such as rising clock edges of the Int_DQS clock, and the data DF received on the second data signal line corresponds to data latched by the input circuit at second clock edges of the Int_DQS clock, such as falling clock edges of the Int_DQS clock. With reference to the example operation of FIG. 3, in some embodiments of the disclosure, the data DR on the first data line corresponds to data D0 and D2, and the data DF on the second data line corresponds to data D1 and D3.

The first data path includes a latch circuit 620, flip-flop circuits 622 and 624, and latch circuits 630 and 632. A DCLK0 clock is provided to the latch circuit 620, and flip-flop circuits 622 and 624, and a DCLK1 clock is provided to the latch circuits 630 and 632. A reset signal DRST is provided to latch circuit 620, and the flip-flop circuits 622 and 624, and the complement of the reset signal DRSTF is provided to the latch circuits 630 and 632. The flip-flop circuits 622 and 624, the latch circuit 620, and latch circuits 630 and 632 are reset to provide respective outputs having a known logic level when the DRST signal is active (e.g., active high logic level). The latch circuit 620 receives input data DR from the first data signal line and provides output data DLAT0 having a logic level corresponding to the logic level of the input data DR when the DCLK0 clock is a high clock level. When the DCLK0 changes from the low clock level to a high clock level, the latch circuit 620 latches the logic level of the input data DR and when DCLK0 changes to low, the 620 latches provide the latched data DLAT0 to clock circuit 622.

The clock circuit 622 provides output data DFF0 having a logic level corresponding to a logic level of the data DLAT0 from the latch circuit 620 when the DCLK0 clock changes from a high clock level to a low clock level. Also, when the DCLK0 clock changes from a high clock level to a low clock level, the clock circuit 624 provides output data DFF2 having a logic level corresponding to a logic level of subsequent input data DR provided to the first data path. As a result, when the DCLK0 clock changes to the low clock level the clock circuit 622 provides data DFF0 received by the first data path at a first time and the clock circuit 624 provides data DFF2 received by the first data path at a second time following the first time.

The data DFF0 and DFF2 are provided to the latch circuits 630 and 632 by the clock circuits 622 and 624, respectively. When the DCLK1 clock is a high clock level, the latch circuit 630 latches output data DD0 having a logic level corresponding to the logic level of the data DFF0 and also the latch circuit 632 latches output data DD2 having a logic level corresponding to the logic level of the data DFF2. When the DCLK1 clock changes from the high clock level to a low clock level, the latch circuits 630 and 632 provide the logic levels of the data DFF0 and DFF2.

The second data path includes latch circuit 621, and flip-flop circuits 623 and 625. The DCLK1 clock is provided to the latch circuit latch circuit 621, and flip-flop circuits 623 and 625. The reset signal DRST is provided to latch circuit 621, and the flip-flop circuits 623 and 625. The flip-flop circuits 623 and 625, and the latch circuit 621 are reset to provide respective outputs having a known logic level when the DRST signal is active (e.g., active high logic level). The latch circuit 621 receives input data DF from the second data signal line and provides output data DLAT1 having a logic level corresponding to the logic level of the input data DF when the DCLK1 clock is a high clock level. When the DCLK1 changes from the low clock level to a high clock level, the latch circuit 621 latches the logic level of the input data.

The clock circuit 623 provides output data DD1 having a logic level corresponding to a logic level of the data DLAT1 from the latch circuit 621 when the DCLK1 clock changes from a high clock level to a low clock level. Also when the DCLK1 clock changes from a high clock level to a low clock level, the clock circuit 625 provides output data DD3 having a logic level corresponding to a logic level of subsequent input data DF provided to the second data path. As a result, when the DCLK1 clock changes to the low clock level, the clock circuit 623 provides data DD1 received by the second data path at a first time and the clock circuit 625 provides data DD3 received by the second data path at a second time following the first time.

As previously described, for the first data path when the DCLK1 clock is a low clock level, the latch circuits 630 and 632 provide output data DD0 and DD2, and for the second data path, when the DCLK1 clock changes to a low clock level, the clock circuits 623 and 625 provide output data DD1 and DD3. Thus, when the DCLK1 clock changes to the low clock level, output data DD0-DD3 are provided in parallel by the deserializer circuit 610.

In some embodiments of the disclosure, the latch circuits 620, 621, 630, and 632, and flip-flop circuits 622, 623, 624, and 625 are provided complementary clocks. For example, the latch circuit 620 and the flip-flop circuits 622 and 624 are provided the DCLK0 clock and also provided the complement of the DCLK0 clock, and the latch circuits 621, 630, and 632, and the flip-flop circuits 623 and 625 are provided the DCLK1 clock and also provided the complement of the DCLK1 clock. The complementary clocks may be provided by clock circuits in some embodiments of the disclosure. The complementary clock circuits may be included in a divider and buffer circuit (e.g., divider and buffer circuit 107 of FIG. 1) in some embodiments of the disclosure. The complementary clock circuits may be included in a deserializer including deserializer circuits in some embodiments of the disclosure. The complementary clock circuits may not be needed, however, when complementary clocks are not provided to the latch circuits and flip-flop circuits and/or complementary clocks are already provided without any additional clock circuits, and are thus optional in some embodiments of the disclosure.

The output data DD0-DD3 is provided in parallel to the data latch circuit 650. The data latch circuit 650 includes buffer circuits 660-663 and latch circuits 670-673. The buffer circuits 660-663 buffer a respective one of the data DD0-DD3 and provide buffered data BDD0-BDD3 to respective ones of the latch circuits 670-673. A clock DGDWClk is provided to the latch circuits 670-673, as well as the DRSTF signal. The DGDWCk clock causes the latch circuits 670-673 to provide and latch the logic levels of the data BDD0-BDD3 and provide data DQn_D0-D3 having the corresponding latched logic level. For example, when the DGDWCk changes to a high clock level the latch circuits 670-673 provide the respective data DQn_D0-D3. The data DQn_D0-D3 may be provided to internal data lines and, for example, written to a memory array.

Figure 7:
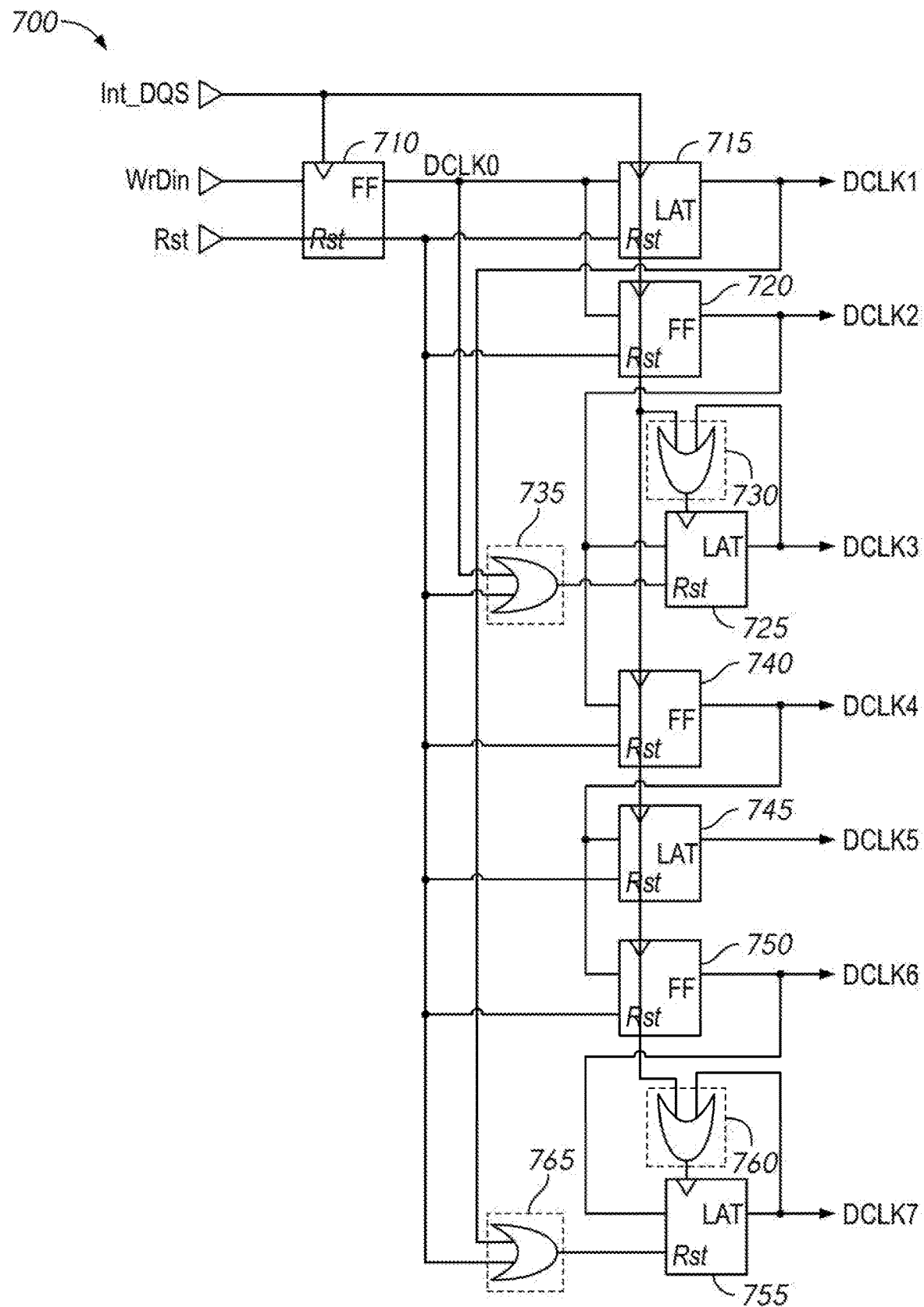
FIG. 7 is a schematic diagram of a multiphase clock circuit according to an embodiment of the disclosure.

FIG. 7 is a schematic diagram of a multiphase clock circuit 700 according to an embodiment of the disclosure. The multiphase clock circuit 700 may be included in a multiphase clock circuit 244 of FIG. 2 in embodiments of the disclosure for deserializing 8-bit bursts of serial data to provide 8-bits of data in parallel. The multiphase clock circuit 700 may be included in the internal data clock circuit 155 of FIG. 1 in some embodiments of the disclosure.

The multiphase clock circuit 700 provides clocks DCLK0-DCLK7 having a phase relationship relative to one another where each of the DCLK0-DCLK7 clocks are shifted by one-half a clock period of an Int_DQS clock relative to at least one of the other DCLK0-DCLK7 clocks. The multiphase clock circuit 700 includes clock circuits 710, 715, 720, 725, 740, 745, 750, and 755. The multiphase clock circuit 700 further includes control circuits 730, 735, 760, and 765. Each of the clock circuits 710, 715, 720, 725, 740, 745, 750, and 755 may include a clocked circuit. For example, in some embodiments of the disclosure, the clock circuits 710, 720, 740, and 750 may include flip-flop (FF) circuits, and the clock circuits 715, 725, 745, and 755 may include latch circuits. The control circuits 730, 735, 760, and 765 may include logic gates, for example, in some embodiments of the disclosure, the control circuits 730, 735, 760, and 765 include OR logic gates (OR).

The clock circuit 710 receives internal write command signal WrDin, and provides a clock DCLK0 having a clock level corresponding to a logic level of the WrDin signal when the Int_DQS clock changes from a low clock level to a high clock level. The DCLK0 clock is provided to clock circuit 715 and clock circuit 720. The DCLK0 is also provided to the control circuits 735 and 765.

The clock circuit 715 provides a clock DCLK1 having a clock level corresponding to the clock level of the DCLK0 clock when the Int_DQS clock is a low clock level. When the Int_DQS changes from the low clock level to a high clock level, the clock circuit 715 latches the clock level of the DCLK0 and provides the DCLK1 clock having a clock level of the latched DCLK0 clock. While latched (e.g., the Int_DQS clock is a high clock level), the clock circuit 715 continues to provide the latched clock level as the DCLK1 clock despite the DCLK0 changing clock levels. The clock circuit 720 provides a clock DCLK2 having a clock level corresponding to the clock level of the DCLK0 clock when the Int_DQS clock changes from a low clock level to a high clock level. The DCLK2 clock is provided to the clock circuit 725.

The clock circuit 725 provides a clock DCLK3 having a clock level of the DCLK2 clock when both the Int_DQS clock is a low clock level and the DCLK3 clock is at a low clock level. When the Int_DQS or the DCLK3 clock changes from the low clock level to a high clock level, the clock circuit 725 latches the clock level of the DCLK2 clock and provides the DCLK3 clock having a clock level of the latched DCLK2 clock. While latched (e.g., the Int_DQS clock or the DCLK3 clock is a high clock level), the clock circuit 725 continues to provide the latched clock level as the DCLK3 clock despite the DCLK2 changing clock levels. The control circuit 730 prevents the clock circuit 725 from changing the clock level of the DCLK3 clock until the clock circuit 725 is again latched by the Int_DQS changing from the low clock level to the high clock level (and/or is reset by the control circuit 735 for a rising clock edge of the DCLK0 clock).

The clock circuit 740 receives the DCLK2 clock, and provides a clock DCLK4 having a clock level corresponding to a logic level of the DCLK2 clock when the Int_DQS clock changes from a low clock level to a high clock level. The DCLK4 clock is provided to clock circuit 745 and clock circuit 750.

The clock circuit 745 provides a clock DCLK5 having a clock level corresponding to the clock level of the DCLK4 clock when the Int_DQS clock is a low clock level. When the Int_DQS changes from the low clock level to a high clock level, the clock circuit 745 latches the clock level of the DCLK4 clock and provides the DCLK5 clock having a clock level of the latched DCLK4 clock. While latched (e.g., the Int_DQS clock is a high clock level), the clock circuit 745 continues to provide the latched clock level as the DCLK5 clock despite the DCLK4 changing clock levels. The clock circuit 750 provides a clock DCLK6 having a clock level corresponding to the clock level of the DCLK4 clock when the Int_DQS clock changes from a low clock level to a high clock level. The DCLK6 clock is provided to the clock circuit 755.

The clock circuit 755 provides a clock DCLK7 having a clock level of the DCLK6 clock when both the Int_DQS clock is a low clock level and the DCLK7 clock is at a low clock level. When the Int_DQS or the DCLK7 clock changes from the low clock level to a high clock level, the clock circuit 755 latches the clock level of the DCLK6 clock and provides the DCLK7 clock having a clock level of the latched DCLK6 clock. While latched (e.g., the Int_DQS clock or the DCLK7 clock is a high clock level), the clock circuit 755 continues to provide the latched clock level as the DCLK7 clock despite the DCLK6 changing clock levels. The control circuit 760 prevents the clock circuit 755 from changing the clock level of the DCLK7 clock until the clock circuit 755 is again latched by the Int_DQS changing from the low clock level to the high clock level (and/or is reset by the control circuit 765 for a rising clock edge of the DCLK1 clock).

The clock circuits 710, 720, 740, and 750, and the clock circuit 715 and 745 are reset to provide respective clocks having a known clock logic level (e.g., low clock level) when the Rst signal is active (e.g., active high logic level). The clock circuit 725 is reset to provide the DCLK3 clock at a known clock level (e.g., low clock level) when the Rst signal is active or when the DCLK0 clock is a high clock level (e.g., before a next rising clock edge for the DCLK3 clock). The clock circuit 755 is reset to provide the DCLK7 clock at a known clock level (e.g., low clock level) when the Rst signal is active or when the DCLK1 clock is a high clock level (e.g., before a next rising clock edge for the DCLK7 clock). While FIG. 7 shows the DCLK0 clock as provided to the control circuit 735 for resetting the clock circuit 725 (e.g., reset DCLK3 to a low clock level) and the DCLK1 clock provided to the control circuit 765 for resetting the clock circuit 755 (e.g., reset DCLK7 to a low clock level), embodiments of the disclosure are not limited to using DCLK0 and DCLK7 for resetting the clock circuits 725 and 735, respectively. Embodiments of the disclosure include providing one or more of DCLK0-DCLK2 clocks to the control circuit 735 for resetting the clock circuit 425, and/or providing one or more of DCLK0-DCLK6 clocks to the control circuit 765 for resetting the clock circuit 755.

Figure 8:
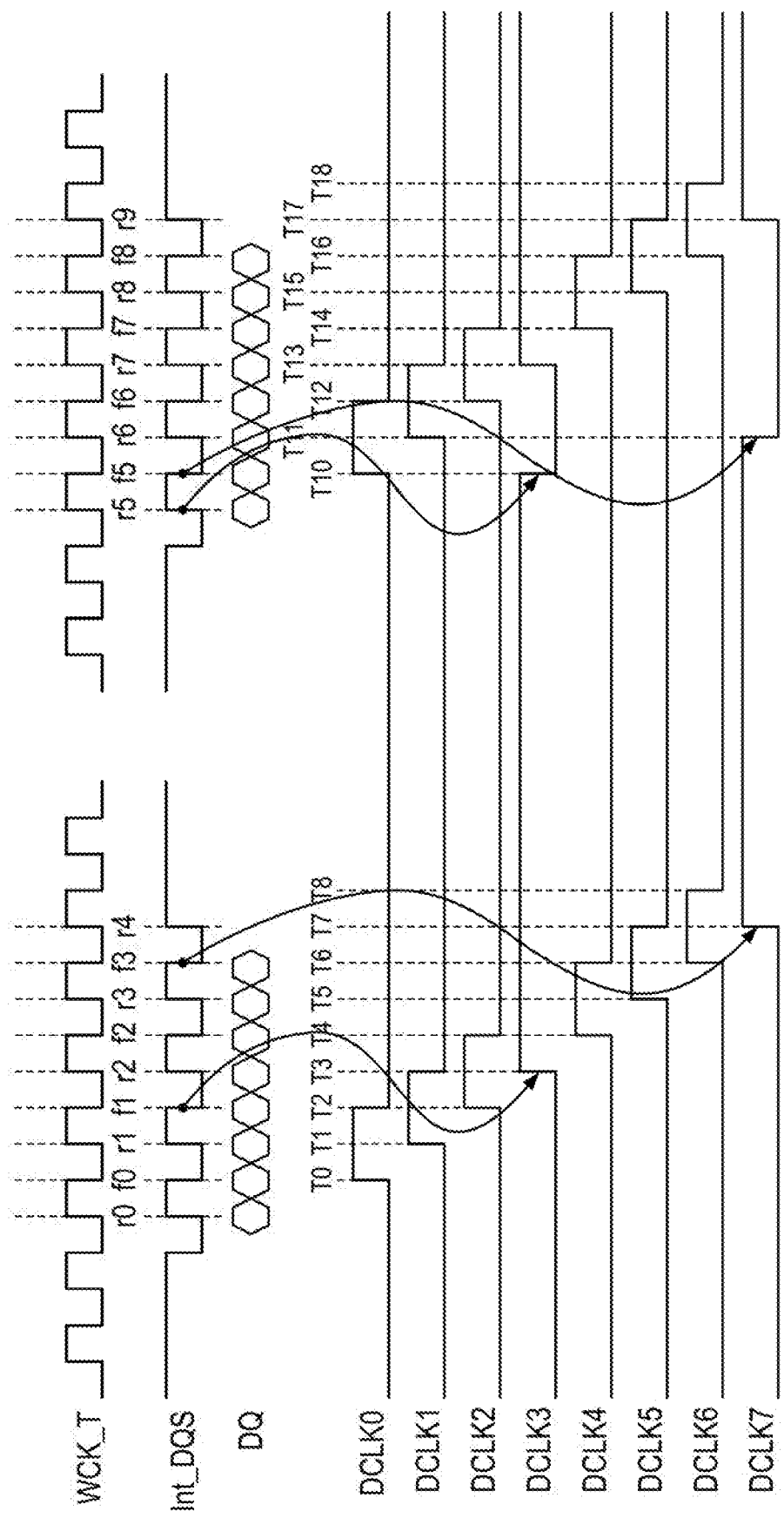
FIG. 8 is a timing diagram of various clocks and signals during operation of the multiphase clock circuit of FIG. 7.

Operation of the multiphase clock circuit 700 will be described with reference to FIG. 8. FIG. 8 is a timing diagram of various clocks and signals during operation of the multiphase clock circuit 700.

FIG. 8 shows external clock WCK_T and the Int_DQS clock along with corresponding data DQ. The data is shown as a burst length of eight bits. Multiphase clocks DCLK0-DCLK7 provided by the multiphase clock circuit 700 are shown having a phase relationship of the clocks being shifted out of phase by one-half clock cycle of the Int_DQS clock relative to another clock.

Prior to time T0, the internal write command WrDin (not shown in FIG. 8) becomes active (e.g., active high logic level). A rising clock edge r0 of the Int_DQS clock causes the clock circuit 710 to later provide a DCLK0 clock having a high clock level following a propagation delay (e.g., at time T0) corresponding to the high logic level of the internal write command WrDin. The r0 clock edge of the Int_DQS clock causes the clock circuit 715 to latch the low clock level and provide the DCLK1 clock having a low clock level corresponding to the low clock level of the DCLK0 clock. The r0 clock edge causes the clock circuit 720 to provide a DCLK2 clock having a low clock level corresponding to the low clock level of the DCLK0 clock, and also causes the clock circuit 725 to latch the low clock level of the DCLK2 clock and provide the DCLK3 clock having a low clock level.

Following the propagation delay, at time T0 the DCLK0 clock provided by the clock circuit 710 changes from the low clock level to the high clock level. The high clock level DCLK0 clock resets the clock circuit 725 to provide a low clock level DCLK3 clock, if not already at a low clock level. A falling clock edge f0 of the Int_DQS clock causes the clock circuit 715 to later provide the DCLK1 clock having the high clock level following a propagation delay (e.g., at time T1) based on the high clock level of the DCLK0 clock. The clock circuit 720 continues to provide the low clock level DCLK2 clock and the clock circuit 725 continues to provide the low clock level DCLK3 clock.

Following the propagation delay, at time T1 the DCLK1 clock provided by the clock circuit 715 changes from the low clock level to the high clock level. The high clock level DCLK1 clock resets the clock circuit 755 to provide a low clock level DCLK7 clock, if not already at a low clock level. A rising clock edge r1 of the Int_DQS clock causes the clock circuit 710 to later provide the DCLK0 clock having a low clock level following a propagation delay (e.g., at time T2) corresponding to the low logic level of the internal write command WrDin (not shown). The r1 clock edge causes the clock circuit 715 to latch the high clock level DCLK0 clock to continue to provide the high clock level DCLK1 clock. The r1 clock edge also causes the clock circuit 720 to later provide the DCLK2 clock having a high clock level following a propagation delay (e.g., at time T2) based on the high clock level of the DCLK0 clock. The r1 clock edge causes clock circuit 725 to latch the low clock level DCLK2 clock to continue providing the low clock level DCLK3 clock.

Following the propagation delay, at time T2 the DCLK0 clock provided by the clock circuit 710 changes from the high clock level to the low clock level and the DCLK2 clock provided by the clock circuit 720 changes from the low clock level to the high clock level.

A falling clock edge f1 of the Int_DQS clock causes the clock circuit 715 to later provide the DCLK1 clock having the low clock level following a propagation delay (e.g., at time T3) based on the low clock level of the DCLK0 clock. The f1 clock edge also causes the clock circuit 725 to later provide the DCLK3 clock having the high clock level following a propagation delay (e.g., at time T3) based on the high clock level of the DCLK2 clock.

Following the propagation delay, at time T3 the DCLK1 clock provided by the clock circuit 715 changes from the high clock level to the low clock level and the DCLK3 clock provided by the clock circuit 725 changes from the low clock level to the high clock level.

A rising clock edge r2 of the Int_DQS clock causes the clock circuit 720 to later provide the DCLK2 clock having a low clock level following a propagation delay (e.g., at time T4) based on the low clock level of the DCLK0 clock. The clock circuit 710 continues to provide the low clock level DCLK0 clock based on the low logic level WrDin command. The rising clock edge r2 further causes the clock circuit 740 to later provide the DCLK4 clock having a high clock level following a propagation delay (e.g., at time T4) based on the high clock level of the DCLK2 clock.

Following the propagation delay, at time T4 the DCLK2 clock provided by the clock circuit 720 changes from the high clock level to the low clock level and the DCLK4 clock provided by the clock circuit 740 changes from the low clock level to the high clock level. A failling clock edge f2 of the Int_DQS clock causes the clock circuit 745 to later provide the DCLK5 clock having the high clock level following a propagation delay (e.g., at time T5) based on the high clock level of the DCLK4 clock. The DCLK3 clock remains at the high clock level as the clock circuit 725 remains latched by the high logic level provided by the control circuit 730. The clock circuit 750 continues to provide the low clock level DCLK6 clock and the clock circuit 755 continues to provide the low clock level DCLK7 clock.

Following the propagation delay, at time T5 the DCLK5 clock provided by the clock circuit 745 changes from the low clock level to the high clock level. A rising clock edge r3 of the Int_DQS clock causes the clock circuit 740 to later provide the DCLK4 clock having a low clock level following a propagation delay (e.g., at time T6) corresponding to the low clock level of the DCLK2 clock. The r3 clock edge causes the clock circuit 745 to latch the high clock level DCLK4 clock to continue to provide the high clock level DCLK5 clock. The r3 clock edge also causes the clock circuit 750 to later provide the DCLK6 clock having a high clock level following a propagation delay (e.g., at time T6) based on the high clock level of the DCLK4 clock. The r3 clock edge causes clock circuit 755 to latch the low clock level DCLK6 clock to continue providing the low clock level DCLK7 clock.

Following the propagation delay, at time T6 the DCLK4 clock provided by the clock circuit 740 changes from the high clock level to the low clock level and the DCLK6 clock provided by the clock circuit 750 changes from the low clock level to the high clock level.

A falling clock edge f3 of the Int_DQS clock causes the clock circuit 745 to later provide the DCLK5 clock having the low clock level following a propagation delay (e.g., at time T7) based on the low clock level of the DCLK4 clock. The f3 clock edge also causes the clock circuit 755 to later provide the DCLK7 clock having the high clock level following a propagation delay (e.g., at time T7) based on the high clock level of the DCLK6 clock.

Following the propagation delay, at time T7 the DCLK5 clock provided by the clock circuit 755 changes from the high clock level to the low clock level and the DCLK7 clock provided by the clock circuit 755 changes from the low clock level to the high clock level. Although not shown in FIG. 8, the DGDWClk clock may be provided based on the DCLK7 clock. As previously described, the DGDWClk clock may be provided to a data latch circuit (e.g., data latch 230 of FIG. 2) that latches and provides data to internal data lines.

A rising clock edge r4 of the Int_DQS clock causes the clock circuit 750 to later provide the DCLK6 clock having a low clock level following a propagation delay (e.g., at time T8) based on the low clock level of the DCLK4 clock. The rising clock edge r4 of the Int_DQS clock also causes the clock circuit 755 to latch the high clock level of the DCLK6 to continue to provide the high clock level DCLK7 clock.

The clock circuit 740 continues to provide the low clock level DCLK4 clock based on the low clock level of the DCLK2 clock.

Following the propagation delay, at time T8 the DCLK6 clock provided by the clock circuit 750 changes from the high clock level to the low clock level. As the Int_DQS clock remains at a high clock level, the clock levels for DCLK0-DCLK7 remain the same following time T8. The DCLK7 clock remains at the high clock level as the clock circuit 755 remains latched by the high logic level provided by the control circuit 760.

A rising clock edge r5 of the Int_DQS clock causes the clock circuit 725 to latch the low clock level of the DCLK2 clock to later provide the DCLK3 clock having a low clock level following a propagation delay (e.g., at time T10). A failing clock edge 5 of the Int_DQS clock causes the clock circuit 755 to later provide the DCLK7 clock having the low clock level following a propagation delay (e.g., at time T11) based on the low clock level of the DCLK6 clock. With the clock circuits 725 and 755 clocked by the Int_DQS clock or the respective DCLK through the control circuits 730 and 760, respectively, the clock circuits 725 and 755 ignore inadvertent changes in the clock level of the Int_DQS clock, which may be caused, for example, by noise in the Int_DQS clock.

The rising clock edge r5 represents the start of a new cycle for providing the DCLK0-DCLK7 clocks as previously described, with the clock edges r5, f5, r6, f6, r7, f7, r8, f8, and r9 representing clock edges r0, f0, r1, f1, r2, f1, r3, f3, r4. As the Int_DQS clock changes between the high and low clock levels at clock edges r5, 5, r6, f6, r7, f7, r8, f8, and r9, a new cycle of DCLK0-DCLK7 clocks are provided between times T10-T18 as previously described for times T0-T8.

Figure 9:
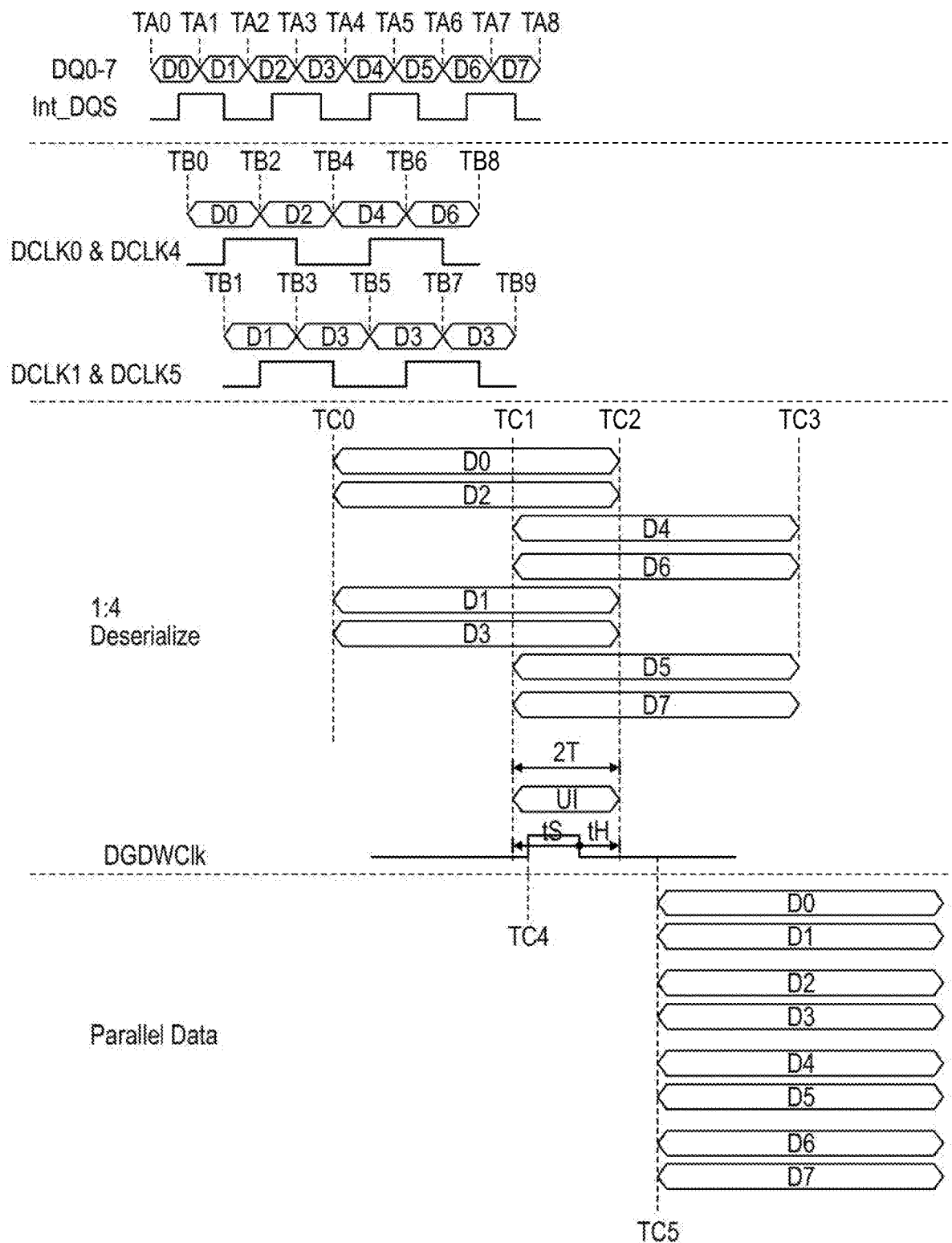
FIG. 9 is a diagram showing an example operation of an input circuit, deserializer circuit, and data latch circuit according to an embodiment of the disclosure.

FIG. 9 is a diagram showing an example operation of an input circuit, deserializer circuit, and data latch circuit according to an embodiment of the disclosure. In some embodiments of the disclosure, the input circuit, deserializer circuit, and data latch circuit are included in the input data buffer 210, deserializer 220, data latch 230, and internal data clock circuit 240 of FIG. 2 and operated as shown in FIG. 3. The operation of FIG. 3 will be described with reference to the input circuit 215, deserializer circuit 225, and data latch circuit 235 of FIG. 2.

Data D0-D7 is received serially by input circuit 215 from the respective data terminal DQ. The data D0-D7 represents a data burst of 8-bits (e.g., burst length BL of 8). Data D0 is provided on the data terminal DQ between times TA0 and TA1, data D1 is provided between times TA1 and TA2, data D2 is provided between times TA2 and TA3, data D3 is provided between times TA3 and TA4, data D4 is provided between times TA4 and TA5, data D5 is provided between times TA5 and TA6, data D6 is provided between times TA6 and TA7, and data D7 is provided between times TA7 and TA8. The time between times TA0-TA1, TA1-TA2, TA2-TA3, TA3-TA4, TA4-TA5, TA5-TA6, TA6-TA7, TA7-TA8 may be equal to one another. The data D0-D7 is latched as the Int_DQS clock transitions between high and low clock levels. For example, data D0, D2, D4, and D6 are latched at rising clock edges of the Int_DQS clock between times TA0 and TA1, TA2 and TA3, TA4 and TA5, and TA6 and TA7, respectively, and data D1, D3, D5, and D7 are latched at falling clock edges of the Int_DQS clock between times TA1 and TA2, TA3 and TA4, TA5 and TA6, and TA7 and TA8.

The latched data are provided on two signal lines by the input circuit 215, with data D0, D2, D4, and D6 (e.g., rising edge data) provided on a first signal line and data D1, D3, D5, and D7 (e.g., falling edge data) provided on a second signal line. On the first signal line, data D0 is provided between times TB0 and TB2, data D2 provided between times TB2 and TB4, data D4 provided between times TB4 and TB6, and data D6 provided between times TB6 and TB8. On the second signal line, data D1 is provided between times TB1 and TB3, data D3 provided between times TB3 and TB5, data D5 between times TB5 and TB7, and data D7 provided between times TB7 and TB9. The time between times TB0-TB2, TB1-TB3, TB2-TB4, TB3-TB5, TB4-TB6, TB5-TB7, TB6-TB8, and TB7-TB9 may be equal to one another. The time a bit of data is provided on the first or second signal line is greater than the time a bit of data is provided on the data terminal DQ. For example, bit of data D0 is provided on the first signal line for a time TB0-TB2 whereas bit of data D0 is provided on the data terminal DQ for a time TA0-TA1. The time TB0-TB2 is greater than time TA0-TA 1. In some embodiments of the disclosure, the time TB0-TB2 is twice as long as time TA0-TA1.

The data D0-D7 provided by the input circuit 215 on the two signal lines are latched by deserializer 225 as one or more of the DCLK0-DCLK7 clocks transition between high and low clock levels. In the example of FIG. 9, four clocks DCLK0 and DCLK4, and DCLK1 and DCLK5 are used by the deserializer 225 to latch the data D0-D7. For example, data D0 is latched at a rising edge of the DCLK0 clock between times TB0 and TB2, data D2 is latched at a falling edge of the DCLK0 clock between times TB2 and TB4, data D4 is latched at a rising edge of the DCLK4 clock between times TB4 and TB6, and data D6 is latched at a failing edge of the DCLK4 clock between times TB6 and TB8. The data D1 is latched at a rising edge of the DCLK1 clock between times TB1 and TB3, data D3 is latched at a falling edge of the DCLK1 clock between times TB3 and TB5, data D5 is latched at a rising edge of the DCLK5 clock between times TB5 and TB7, data D7 is latched at a failling edge of the DCLK5 clock between times TB7 and TB9.

The latched data are provided on respective signal lines by the deserializer circuit 225. The data D0-D3 are provided between times TC0 and TC2 and data D4-D7 are provided between times TC1 and TC3. The time a bit of data is provided on the respective signal lines is greater than the time a bit of data is provided on the first or second signal lines (and also greater than the time a bit of data is provided to the input circuit 215 on the data terminal DQ). For example, the time data D0 is provided between times TC0-TC2 may is greater than the time data D0 is provided between times TB0-TB2 (and greater than the time between times TA0-TA1). In some embodiments of the disclosure, the time TC0-TC2 is four times as long as time TB0-TB2 (and eight times as long as time TA0-TA1).

The data on the respective signal lines is provided to data latch circuits 235. The data is latched by the data latch circuits 235 and then provided to internal data lines to be written to the memory array. For example, data D0-D3 may be latched by the data latch circuits 235 based on the DCLK3 clock and data D4-D7 may be latched by the data latch circuits 235 based on the DCLK7 clock. The data latch circuits 235 may provide the data D0-D7 to the internal data lines based on the DGDWClk clock. For example, in an example operation DGDWClk clock becomes active at time TC4 and the latched data is provided at time TC5. The DGDWClk clock becomes active at time when data D0-D7 are concurrently available, which is between times TC1 and TC2. In some embodiments of the disclosure, the DGDWClk clock is based on the DCLK7 clock.

As shown by the example operation of FIG. 9, data provided serially on data terminal DQ may be deserialized and provided in parallel, for example, for writing to a memory array. The data may be provided in parallel by data latch circuits 235 for a greater time than provided on the data terminal DQ to the input circuit 215. In this manner, there is greater timing margin for performing internal operations, such as writing data to the memory array.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a plurality of clock circuits, each including an input node, output node, reset node, and control clock node, each clock circuit of the plurality of clock circuits configured to provide a respective output clock at the output node based on a respective input at the input node, a first one of the plurality of clock circuits configured to receive a command at the input node;
a first control circuit including first and second inputs and an output, the first control circuit coupled to receive a first output clock provided by one of the plurality of clock circuits except for a last one of the plurality of clock circuits at the first input and coupled to receive a reset signal at the second input, the first control circuit configured to provide an output signal based on the first output clock and the reset signal to the reset node of the last one of the plurality of clock circuits; and
a second control circuit including first and second inputs and an output, the second control circuit coupled to receive a control clock at the first input and coupled to receive an output clock provided by the last one of the plurality of clock circuits at the second input, the second control circuit configured to provide an output signal based on the control clock and the output clock to the control clock node of the last one of the plurality of clock circuits.

2. The apparatus of claim 1 wherein the first control circuit comprises an OR logic gate and the second control circuit comprises an OR logic gate.

3. The apparatus of claim 1 wherein the first one of the plurality of clock circuits comprises a flip-flop circuit.

4. The apparatus of claim 1 wherein the last one of the plurality of clock circuits comprises a latch circuit.

5. The apparatus of claim 1 wherein the plurality of clock circuits comprises four clock circuits, two of which comprise flip-flop circuits and another two of which comprise latch circuits.

6. The apparatus of claim 1 wherein the plurality of clock circuits comprises a second clock circuit and a third clock circuit, the second and third clock circuits configured to receive at respective input nodes the first output clock provided by the first one of the plurality of clock circuits and the third clock circuit configured to provide an output to the input node of the last one of the plurality of clock circuits.

7. The apparatus of claim 1 wherein the plurality of clock circuits comprises eight clock circuits, four of which comprise flip-flop circuits and another four of which comprise latch circuits.

8. The apparatus of claim 7, further comprising:
a third control circuit including first and second inputs and an output, the third control circuit coupled to receive a second output clock provided by a second one of the plurality of clock circuits at the first input and coupled to receive the reset signal at the second input, the first control circuit configured to provide an output signal based on the second output clock and the reset signal to the reset node of another one of the plurality of clock circuits; and
a fourth control circuit including first and second inputs and an output, the fourth control circuit coupled to receive the control clock at the first input and coupled to receive an output clock provided by the another one of the plurality of clock circuits at the second input, the fourth control circuit configured to provide an output signal based on the control clock and the output clock to the control clock node of the another one of the plurality of clock circuits.

9. The apparatus of claim 1 wherein the second control circuit is configured to prevent the last one of the plurality of clock circuits from changing a clock level of its output clock.

10. The apparatus of claim 1 wherein the respective output clocks from the plurality of clock circuits are shifted by one-half a clock period of the control clock relative to one another.

11. An apparatus, comprising:
an input data buffer including a plurality of input circuits, each configured to receive respective data, the control clock, and a reference voltage, and each further configured to provide internal data based on the respective data relative to the reference voltage and responsive to a control clock;
a deserializer including a plurality of deserializer circuits, each configured to receive the internal data serially from a respective one of the plurality of input circuits and to receive at least one of the multiphase clocks, each further configured to provide the internal data in parallel responsive to the at least one multiphase clock; and
a data latch including a plurality of latch circuits, each configured to receive the internal data from a respective one of the deserializer circuits and to receive the write clock, each further configured to provide the internal data from the respective one of the deserializer circuits as internal write data responsive to a write clock,
a data clock circuit configured to receive a data clock and including a data clock input buffer configured to receive the data clock and provide the control clock responsive to the data clock, and further including a multiphase clock circuit configured to receive the control clock and an internal write command and to provide the multiphase clocks responsive to the control clock and an active write command, the data clock circuit further including a write clock circuit configured to receive at least one of the multiphase clocks and provide the write clock responsive to the at least one of the multiphase clocks, wherein the multiphase clock circuit comprises:
a plurality of clock circuits, each configured to provide one of the multiphase clocks responsive to a respective input clock;
a first control circuit configured to receive a first one of the multiphase clocks and a reset signal provided to the plurality of clock circuits, and configured to provide a first control signal to reset a clock circuit of the plurality of clock circuits that is based on the first one of the multiphase clocks and the reset signal; and a second control circuit configured to receive the control clock and a second one of the multiphase clocks and provide a second control signal to clock the clock circuit of the plurality of clock circuits that is based on the control clock and the second one of the multiphase clocks.

12. The apparatus of claim 11 wherein a deserializer circuit of the deserializer comprises:
a first data path configured to serially receive first data and provide the first data in parallel responsive to a first clock; and
a second data path configured to serially receive second data and provide the second data in parallel responsive to a second clock,
wherein the first and second clock are from the multiphase clocks from the data clock circuit.

13. The apparatus of claim 11 wherein the plurality of clock circuits comprises a plurality of latch circuits and a plurality of flip-flop circuits, a latch circuit of the plurality of latch circuits provided the first and second control signals.

14. The apparatus of claim 11 wherein the plurality of clock circuits comprises first and second flip-flop circuits and first and second latch circuits, an output of the first flip-flop circuit provided to an input of the first latch circuit and an input of the second flip-flop circuit, and an output of the second flip-flop circuit provided to an input of the clock circuit configured to receive the first and second control signals.

15. The apparatus of claim 11 wherein the first control circuit comprises a first OR logic gate configured to provide the first control signal to a reset input of the clock circuit of the plurality of clock circuits and the second control circuit comprises a second OR logic gate configured to provide the second control signal to a clock input of the clock circuit of the plurality of clock circuits.

16. The apparatus of claim 11 wherein the plurality of clock circuits of the multiphase clock circuit are configured to provide eight multiphase clocks.

17. A method, comprising:
providing a first clock responsive to an internal command and a control clock;
providing second and third clocks responsive to the first clock and the control clock;
providing a fourth clock responsive to the third clock and at least one the control clock or the fourth clock;
preventing the fourth clock from changing clock levels responsive to an active fourth clock and a high clock level control clock; and
resetting the fourth clock responsive to an active first clock.

18. The method of claim 17, further comprising deserializing first and second serial data and providing the first and second data in parallel responsive to at least one of the first, second, third, or fourth clocks.

19. The method of claim 17 wherein the internal command comprises an internal write command.

20. The method of claim 17, further comprising:
providing a fifth clock responsive to the third clock and the control clock;
providing sixth and seventh clocks responsive to the fifth clock and the control clock;
providing an eighth clock responsive to the seventh clock and at least one the control clock or the eighth clock;
preventing the eighth clock from changing clock levels responsive to an active eighth clock and a high clock level control clock; and
resetting the eighth clock responsive to an active first clock.

* * * * *